United States Patent
Sutera et al.

(10) Patent No.: US 6,900,674 B2
(45) Date of Patent: May 31, 2005

(54) METHOD AND CIRCUITRY FOR PHASE ALIGN DETECTION IN MULTI-CLOCK DOMAIN

(75) Inventors: Massimo Sutera, Sunnyvale, CA (US); David A. Bunsey, Jr., Santa Clara, CA (US); Daniel Y. Cheung, Cupertino, CA (US); Lan Lee, Palo Alto, CA (US); Kevin B. Normoyle, Santa Clara, CA (US); Sung-Hun Oh, Sunnyvale, CA (US); Shi-Chin Ou-Yang, San Francisco, CA (US); Fabrizio Romano, deceased, late of Palermo (IT); by Ivana Capellano, legal representative, Palermo (IT)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/375,587

(22) Filed: Feb. 27, 2003

(65) Prior Publication Data

US 2004/0100308 A1 May 27, 2004

Related U.S. Application Data

(60) Provisional application No. 60/428,168, filed on Nov. 21, 2002.

(51) Int. Cl.$^7$ .................................... H03L 7/00
(52) U.S. Cl. ........................... 327/144; 327/160
(58) Field of Search .......................... 327/144, 145, 327/160, 291, 294, 296, 298; 331/17, 25; 375/373, 375, 376

(56) References Cited

U.S. PATENT DOCUMENTS

| | | | | |
|---|---|---|---|---|
| 4,153,814 A | * | 5/1979 | Burgert | 375/242 |
| 4,973,860 A | * | 11/1990 | Ludwig | 327/145 |
| 5,099,141 A | * | 3/1992 | Utsunomiya | 327/99 |
| 5,604,775 A | * | 2/1997 | Saitoh et al. | 375/376 |
| 2002/0044000 A1 | * | 4/2002 | Hatanaka | 327/291 |

* cited by examiner

*Primary Examiner*—Linh My Nguyen
(74) *Attorney, Agent, or Firm*—Zagorin O'Brien Graham LLP

(57) ABSTRACT

In an embodiment, present application describes a system and method to detect the alignment of multiple clocks in multi-clock domains system. In some variations, multiple clocks are derived from one or more reference clocks using various PLLs. The derived clocks maintain frequency relationship with the reference clock. In some variations, a relationship between the frequencies of various clocks is used to generate the alignment signals in the domain of one of the clocks.

39 Claims, 3 Drawing Sheets

METHOD AND CIRCUITRY FOR PHASE ALIGN DETECTION IN MULTI-CLOCK DOMAIN

CROSS-REFERENCE TO RELATED APPLICATION(S)

This application claims the benefit under 35 U.S.C. §119 (e) of U. S. Provisional Application No. 60/428,168, filed Nov. 21, 2002, which application is incorporated herein by reference in its entirety.

BACKGROUND

1. Field of the Invention

This invention relates to Phase Locked Loop (PLL) circuits and more specifically to phase align detection circuits in a multi-clock domain.

2. Description of the Related Art

Generally, PLLs are used to generate multiple clock frequencies from a reference clock in a system. PLLs synthesize multiple clocks in a predefined frequency relationship to the reference clock frequency in the same clock domain. However, in a system with multiple clock domains, when signals cross clock domain then due to jitters and errors generated by PLLs in each clock domain, it is difficult to determine clocks' alignment even when the clocks are derived from a single reference.

An apparatus and method is needed to determine the alignment of clocks in multiple clock domains system.

SUMMARY

The present application describes techniques to detect the alignment of multiple clocks in multi-clock domains system. Often, multiple clocks are derived from one or more reference clocks using respective PLL circuits. The derived clocks maintain frequency relationship with the reference clock. Often, a relationship between the frequency of a first clock and the desired frequency of an alignment clock is used to generate the alignment clock in the domain of the first clock.

In some embodiments, a method is employed to detect phase alignment in multi-clock domains. The method includes generating a first strobe at a number of cycles of a first clock, generating a second strobe when the first clock and a second clock are active and generating an alignment signal when the first and second strobes and the second clock are aligned. The alignment signal can be generated in any clock domain. In some embodiments, the alignment signal is generated in the second clock domain.

In some embodiments, the number of clock cycles of the first clock represents a frequency ratio between the second clock and the alignment signal. In some variations, the frequency ratio is an integer number and if the frequency ratio is not an integer number, the frequency ratio is converted to an integer number by multiplying the ratio with the smallest integer number required to produce an integer number product. In some variations, the first and the second clocks are each derived from a reference clock. In some variations, the first clock is the reference clock and the second clock is derived from the first clock. In some variations, the number of clock cycles of the first clock is predetermined. In other variations, the number of clock cycles of the first clock is dynamically calculated based on the desired frequency of the alignment signal.

In some embodiments, a system is employed to detect phase alignment in a multi-clock domain. The system includes a counter configured to generate a first strobe at a number of cycles of a first clock, a first flip-flop coupled to the counter and configured to generate a second strobe when the first clock occurs coincident with a second clock and a second flip-flop coupled to the counter and configured to generate an alignment clock when the first and second strobes are coincident with the second clock.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The present application describes a system and method to detect clock alignment in a multi-clock domain system. Generally in a multi-clock domain system, various clocks are derived from one or more reference clocks using various PLLs known in the art. Each derived clock maintains a frequency relationship with the reference clock. For example, if a 10 MHz clock is derived from a 1 MHz reference then there is a ratio of 10 between the two clocks. Similarly, if a 20 MHz clock is derived from the 1 MHz clock then the frequency ratio between 20 MHz and 1 MHz clocks is 20. When the 10 MHz clock and the 20 MHz clocks are derived from the same reference 1 MHz clock, there is also a frequency relationship between 10 MHZ and 20 MHz clocks (i.e., a ratio of 2). In an embodiment, the frequency relationships between various clocks in a system are used to generate an alignment clock when these various clock are aligned in a selected clock's domain. In some variations, the alignment clock can be aligned in any clock's domain.

System Architecture

Figure 1A:
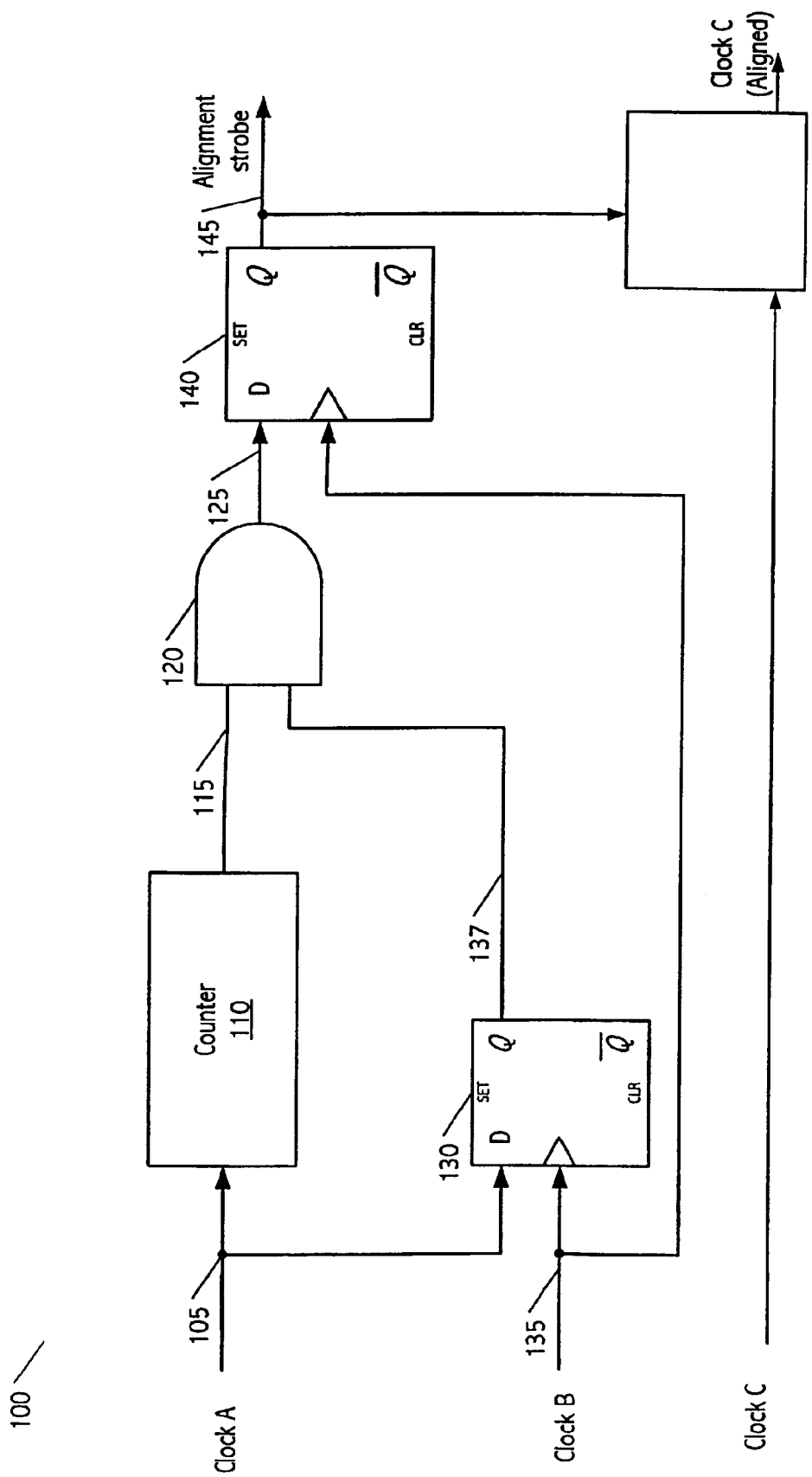
FIG. 1A illustrates an example of a system for aligning clocks in a multiple clock domain according to an embodiment of the present invention.

FIG. 1A illustrates an example of a system 100 for aligning clocks in a multiple clock domain according to an embodiment of the present invention. System 100 includes two clocks, clock A and clock B. Clocks A and B can be any clocks (e.g., clocks from different domains or the like). For purposes of illustration, in the present example, two clocks are used to illustrate the clock alignment however one skilled in the art will appreciate that the invention can be used to align various numbers of clocks. In the present example, clock A is a reference clock and clock B is derived from clock A thus creating a relationship between clock A and clock B. The relationship between clocks A and B can be expressed as B=M*A. Where M can be any integer. One skilled in art will appreciate that while clock B is expressed as multiple of clock A however, clock B frequency can be a fraction of clock A. Similarly, clock B can be a reference clock and clock A can be derived from clock B or the like.

A counter 110 receives clock A on a link 105. Counter 110 can be any counter (e.g., programmable counter, fixed rate counter, discrete, integrated or the like). For purposes of illustration, in the present example, counter 110 is a stand alone programmable counter however one skilled in art appreciate that counter 110 can be integrated in a processor or a processor (or controller) can perform the function of counter 110 or the like. Counter 110 can be programmed to store various frequency relationship ratios of various clocks. In the present example, counter 110 counts the clock cycles of clock A and generates a strobe on link 115 at the end of a programmed count. Counter 110 resets after generating the strobe and starts counting the clock cycles again. The output of counter 110 is coupled to an input of an AND gate 120 via link 115.

A flip-flop 130 receives clock A on link 105 at its input and clock B on a link 135 at its clock input. The output of flip-flop 130 is coupled via a link 137 to the other input of AND gate 120. The output of AND gate 120 is coupled to the input of a flip-flop 140. Flip-flop 140 also receives clock B via link 135 at its clock input. In the present example, when clocks A & B are aligned, an alignment strobe, is generated on the output link 145. Alignment strobe is aligned in clock B domain and can be used to force phase of any clock. When the alignment strobe is used to force the phase of a clock, for example, clock C, the clock C can be aligned with clock A and B at every alignment strobe. A relationship between clocks A, B and C can be expressed as:

$$K*A=L*B=M*C$$

where K, L and M are integers. This relationship illustrates that at every K cycles of clock A or at every L cycles of clock B or every M cycles of clock C, all three clocks are aligned. Thus, by counting in any clock domain, a determination can be made as to the alignment of the other clocks. The frequency relationship of clocks A, B and C can be expressed as:

$$fB/fA=y*fB/fC$$

where fA, fB and fC are the frequencies of clocks A, B and C respectively and 'y' is a factor between the ratios of the clock frequencies of clocks A, B and C. In the present example, counter 110 is programmed to store the frequency ratio of clocks B and C. For example, if fA is 150 MHz, fB is 1200 MHz and fC is 120 MHz then 'y' is given as:

$$1200/150=y*1200/120$$

$$8=y*10$$

$$y=0.8$$

Thus, to convert 'y' into an integer, 'y' can be multiplied by a factor 'z' where 'z' is the smallest integer which when multiplied by 'y', results in an integer. In the present example, to convert 'y' into an integer, the smallest integer for 'z' is 5. Thus, z*y=0.8*5=4. Therefore, counter 110 is set to count up to 4. To find the correct setting of counter 110, the smallest integer 'z' is identified which when multiplied by factor 'y', results in an integer. Counter 110 can be programmed to count to this resulting integer.

While only two clocks are shown, one skilled in art will appreciate that system 100 can be expanded (e.g., by cascading a number of system 100 or the like) to detect an alignment of various clocks in multi clock domain. While an exemplary circuit is shown in FIG. 1, one skilled in the art will appreciate that alternatively, such actions may be embodied in the structure of circuitry that implements such functionality, such as the micro-code of a complex instruction set computer (CISC), firmware programmed into programmable or erasable/programmable devices, the configuration of a field-programmable gate array (FPGA), the design of a gate array or full-custom application-specific integrated circuit (ASIC), or the like.

System Function

The enable logic (e.g., high or low) can be determined according to the technology used in various components. For purposes of illustrations, in the present example, all signals are illustrated as active high; however, one skilled in art will appreciate that these signals can be designed as active low. In the present example, initially, counter 110 counts the number of cycles of clock A up to the programmed ration (e.g., 11 as explained herein or the like). At the end of the count, counter 110 generates a signal (e.g., a high signal, a low signal or the like) on link 115. This signal enables one of the inputs of AND gate 120. Flip-flop 130 also receives clock A. Flip-flop 130 generates an output on link 137 when it is enabled. Flip-flop 130 is enabled when clock A is present at its input and clock B is also active at the same time (i.e. clocks A and B are active). When both inputs of flip-flop 130 are active, a signal (e.g., a high signal, a low signal or the like) is generated on link 137 which enables the other input of AND gate 120. However, at that time, the input at link 115 may no longer be active because counter 110 may have reset.

At certain point, both clocks A and B get aligned and counter 110 generates a signal at its output causing both the inputs of AND gate 120 to be active (enabled). When clocks A & B are aligned, AND gate 120 is enabled, the AND gate output on link 125 is enabled (e.g., high or the like). Because clocks A & B are active at this point, flip-flop 140 also gets enabled and generates an alignment strobe for clock C. Clock C can be forced aligned in clock B domain using the alignment strobe. Similarly, clock C can be forced aligned in any clock domain representing the alignment of various clocks in that clock's domain.

While not shown in FIG. 1, one skilled in the art will appreciate that programmable counter 110 can be pre-programmed for frequency ratios or can be dynamically programmed (e.g., by a processing unit or the like). Also, multiple counters (e.g., counter 110 or the like) can be combined with a selection mechanism (e.g., multiplexers or the like) to select various clocks. Programmable counter 110 can be reset using a reset strobe or can be programmed to rollover at the end of the programmed count.

Figure 1B:
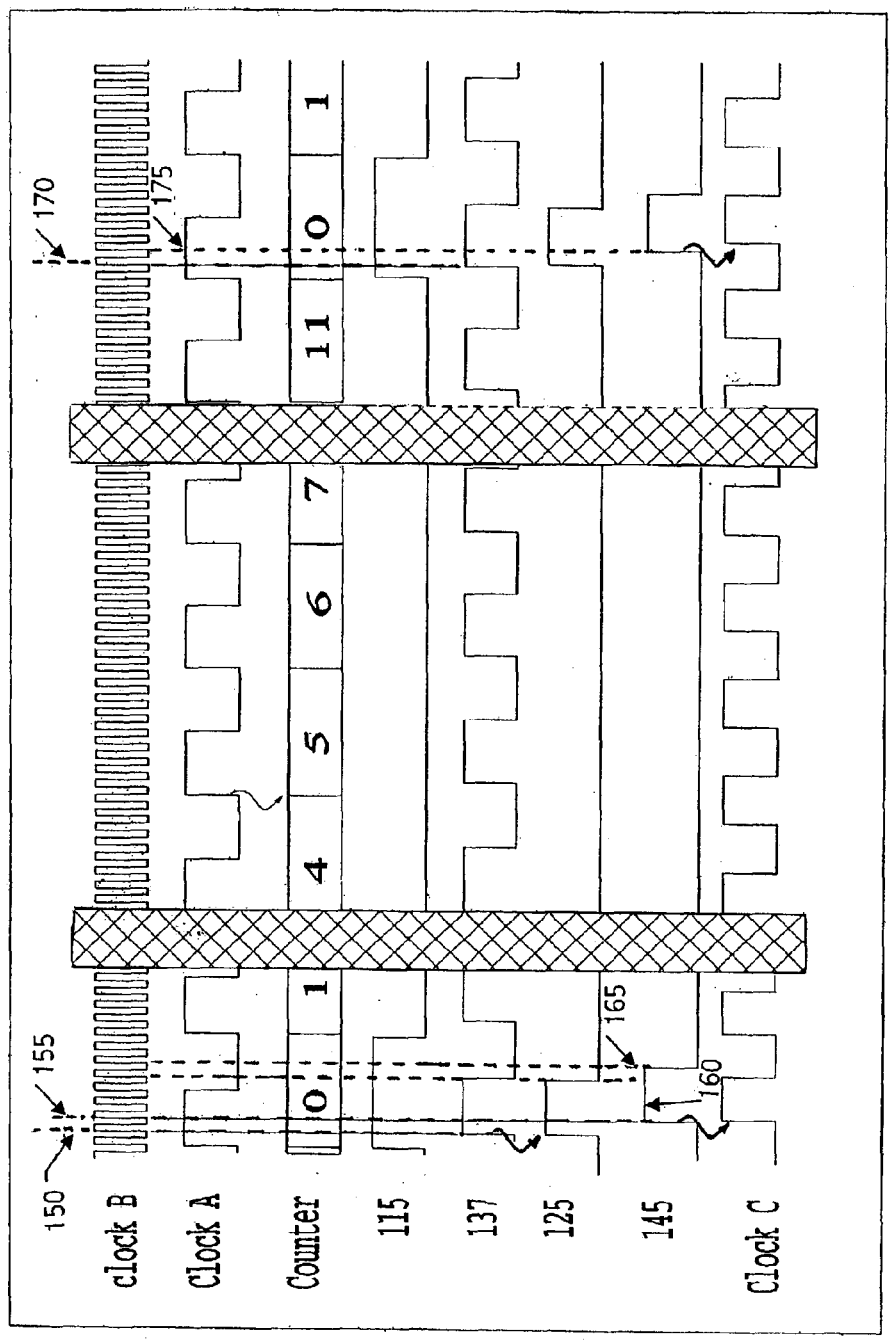
FIG. 1B illustrates an example of waveforms for a system for aligning clocks in a multiple clock domain according to an embodiment of the present invention.

FIG. 1B illustrates an example of waveforms for system 100 according to an embodiment of the present invention. Initially, the output of counter 110 is high causing a high pulse on link 115. After clock A rises, flip-flop 130 latches the input at the next rising edge of clock B (150) causing the output on link 137 to rise. At that point, both the inputs of AND gate 120 (115 and 137) are high, thus causing the output on link 125 to rise. Flip-flop 140 latches the high output of AND gate 120 at the next rising edge of clock B (155) causing the output on link 145 to rise. When the input of flip-flop 130 goes low with clock A, flip-flop 130 latches the input at the next rising edge of clock B (160) causing the output of flip-flop 140 to go low on the next rising edge of clock B (165) thus generating the alignment strobe on link 145.

The alignment strobe on link 145 can be used to force the phase alignment of clock C (155). The phase of clock C can be aligned using various techniques known in the art. At the completion of the first cycle of clock A, the output of counter 110 goes low and counter 110 starts counting the number of clock cycles in clock A. In the present example, the frequency relationships of clock A, B and C requires counter 110 to count up to 11 cycles of clock A. At the completion of the count, the output of counter on link 115 rises causing the output of flip-flop 130 to rise on the next rising edge of clock B. This generates another alignment strobe on link 145 at the next rising edge of clock B (175). The alignment strobe can be used to realign clock C (if needed). Similarly, various other clocks can be generated, aligned or realigned using the alignment strobe on link 145.

Figure 2:
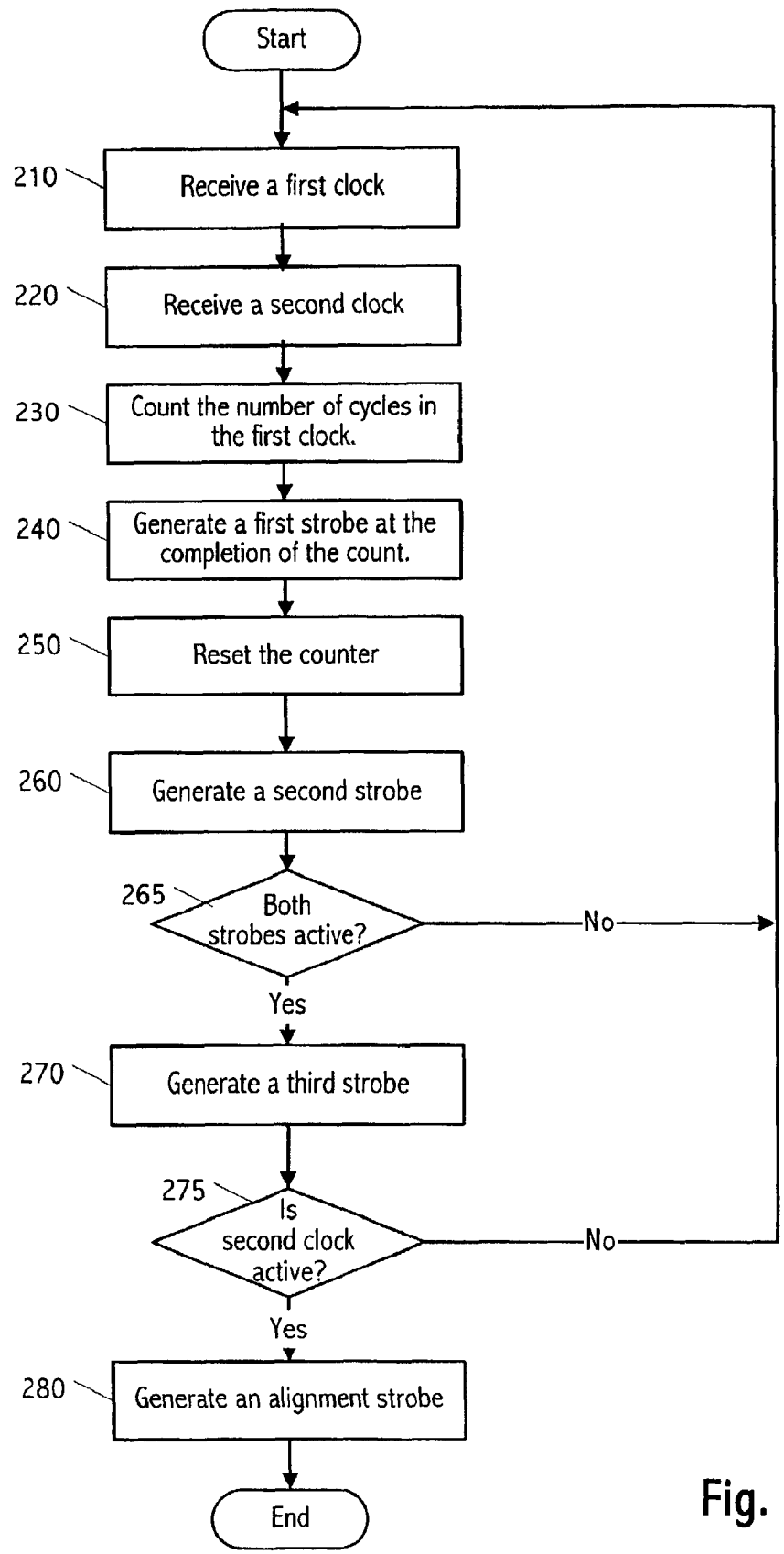
FIG. 2 is a flow diagram illustrating the steps performed during a process of detecting an alignment of two clocks according to an embodiment of the present invention.

FIG. 2 is a flow diagram illustrating an exemplary sequence of operations performed during a process of generating an alignment clock in a multi-clock domain according to an embodiment of the present invention. While the operations are described in a particular order, the operations described herein can be performed in other sequential orders (or in parallel) as long as dependencies between operations allow. In general, a particular sequence of operations is a matter of design choice and a variety of sequences can be appreciated by persons of skill in art based on the description herein.

Initially, the system receives a first clock (e.g., at a counter or the like) (210). The system receives a second clock (e.g., at a flip-flop of the like) (220). The first and the second clocks have a frequency relationship (e.g., both clocks derived from a single source, one clock derived from the other or the like). For purposes of illustration, in the present example, the second clock is derived from the first clock. The system counts (e.g., using a counter or the like) the number of cycles of the first clock up to the frequency ratio between the first clock and the alignment clock that is desired to be generated at a certain frequency (230).

At the completion of the count, the system generates a first strobe (240). The system resets the counter (e.g., counter rolls over or the like) (250). The counter can be any counter known in the art for counting and generating a strobe at the end of the count (e.g., hardware or software programmed or the like). The system generates a second strobe when the first and the second clocks are active (e.g., using a flip-flop as shown in FIG. 1 or the like) (260). One skilled in the art will appreciate that first and second strobes can be generated in parallel (i.e., e.g., using a system such as system 100 as shown in FIG. 1 or the like). The system determines whether the first and the second strobes are active at the same time (e.g., using an AND gate or the like) (265). If both the strobes are not active, the system continues to receive the clocks (210).

When the first and the second strobes are active, the system generates a third strobe (270). The system determines whether the second clock is active when the third strobe is generated (275). If the second clock is not active at the time the third strobe is generated, the system continues to receive the clocks (210). If the second clock is active when the third strobe is generated, the system generates an alignment clock pulse by combining the third strobe and the second clock (e.g., using a flip-flop or the like) (280). The alignment clock is aligned in the second clock domain.

While particular embodiments of the present invention have been shown and described, it will be clear to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method of detecting phase alignment comprising:
   generating a first signal having a period corresponding to a number of cycles of a first clock;
   generating an aligned version of the first clock, wherein the aligned version of the first clock is aligned with a second clock;
   asserting a second signal when the first signal is aligned with the aligned version of the first clock; and
   asserting an alignment indicator in response to the second clock, wherein the alignment indicator is asserted substantially coincident with the asserting of the second signal.

2. The method of claim 1, further comprising:
   using said alignment indicator to align a phase of a third clock.

3. The method of claim 1, wherein said alignment indicator is aligned in a second clock domain.

4. The method of claim 1, wherein said number of cycles of said first clock is predetermined.

5. The method of claim 1, wherein said number of cycles of said first clock is dynamically calculated.

6. The method of claim 2, wherein said number of cycles of said first clock represents a frequency ratio between said first, second and third clocks.

7. The method of claim 6, wherein said frequency ratio is an integer.

8. The method of claim 6, further comprising:
   converting said frequency ratio to an integer.

9. The method of claim 1, wherein
   a counter counts said number of cycles of said first clock; and
   said first signal is generated by said counter.

10. The method of claim 9, further comprising;
    resetting said counter in response to said first signal being asserted.

11. The method of claim 1, wherein said first and said second clocks are derived from a reference clock.

12. The method of claim 11, wherein
    said first clock is said reference clock; and
    said second clock is derived from said first clock.

13. An apparatus for detecting phase alignment comprising:
    a counter to generate a first signal having a period corresponding to a number of cycles of a first clock;
    logic coupled to said counter to assert a second signal when the first signal is aligned with an aligned version of the first clock, the aligned version of the first clock being aligned with a second clock; and
    a state element coupled to said logic to assert an alignment indicator in response to the second clock, wherein the alignment indicator is asserted substantially coincident with the asserting of the second signal.

14. The apparatus of claim 13, wherein said alignment indicator is used to align a phase of a third clock.

15. The apparatus of claim 13, wherein said logic includes an AND gate and said state element includes a flip-flop.

16. The apparatus of claim 13, wherein said number of clock cycles of said first clock is predetermined.

17. The apparatus of claim 13, wherein said number of clock cycles of said first clock is dynamically calculated.

18. The apparatus of claim 13, wherein said counter is further configured to reset in response to said first signal being generated.

19. The apparatus of claim 13, wherein said first and said second clocks are derived from a reference clock.

20. The apparatus of claim 19, wherein said first clock is said reference clock; and said second clock is derived from said first clock.

21. The apparatus of claim 14, wherein said number of cycles of said first clock represents a frequency ratio between said first and second clocks and said third clock.

22. The apparatus of claim 21, wherein said frequency ratio is an integer.

23. The apparatus of claim 13, wherein said counter is further configured to count said number of cycles of said first clock; and generate said first signal at an end of said count of said number of cycles of said first clock.

24. An apparatus for detecting phase alignment comprising:

means for generating a first signal having a period corresponding to a number of cycles of a first clock;

means for generating an aligned version of the first clock, wherein the aligned version of the first clock is aligned with a second clock;

means for asserting a second signal when the first signal is aligned with the aligned version of the first clock; and means for asserting an alignment indicator in response to the second clock, wherein the alignment indicator is asserted substantially coincident with the asserting of the second signal.

25. The apparatus of claim 24, further including means for dynamically determining the number of clock cycles.

26. The apparatus of claim 24, wherein said means for generating a first signal includes means for counting said number of cycles of said first clock.

27. The apparatus of claim 26, further including:

means for resetting said counting means in response to said first signal being asserted.

28. The apparatus of claim 24, further including means for aligning a version of the first clock with the second clock.

29. The method of claim 11, wherein said second clock corresponds to said reference clock; and said first clock is derived from said second clock.

30. The apparatus of claim 19, wherein said second clock corresponds to said reference clock; and said first clock is derived from said second clock.

31. A method comprising:

determining whether multiple clocks, each having a known frequency relationship to a reference clock, are aligned with the reference clock without checking all of the multiple clocks for alignment, wherein the determining whether the multiple clocks are aligned includes checking at least one of the multiple clocks for alignment with the reference clock by counting a number of cycles of the at least one clock and asserting a first signal in response to a number of clock cycles counted;

generating an aligned version of the at least one clock, wherein the aligned version of the at least one clock is aligned with a second clock, and asserting a second signal when the first signal is aligned with the aligned version of the at least one clock signal.

32. The method of claim 31, wherein determining whether multiple clocks are aligned with the reference clock includes checking only one of the multiple clocks for alignment.

33. The method of claim 31, further including:

asserting an alignment indicator substantially coincident with the second signal, wherein the alignment indicator is aligned with the second clock.

34. The method of claim 33, wherein asserting an alignment indicator includes generating an alignment strobe using the second signal and the second clock.

35. The method of claim 33, further including using said alignment indicator to synchronize one or more of the plurality of clocks to the reference clock.

36. An integrated circuit device comprising:

a plurality of signal paths, each of the plurality of signal paths associated with at least one clock of a plurality of clocks, wherein each of the plurality of clocks has a known frequency relationship to a reference clock;

an alignment circuit to determine, without checking all of the multiple clocks for alignment, whether the plurality of clocks are aligned with the reference clock;

a counter to count a number of cycles of the at least one clock and assert a first signal in response to a number of clock cycles counted;

a first state element to generate an aligned version of the at least one clock, wherein the aligned version of the at least one clock is aligned with a second clock; and logic to assert a second signal when the first signal is aligned with the aligned version of the at least one clock signal.

37. The integrated circuit of claim 36, wherein the alignment circuit determines whether multiple clocks are aligned with the reference clock by checking only one of the plurality of clocks for alignment.

38. The integrated circuit of claim 36 further including:

a second state element to assert an alignment indicator substantially coincident with the second signal, wherein the alignment indicator is aligned with the second clock.

39. The integrated circuit of claim 38, wherein the first state element and the second state element are flip-flops.

* * * * *